(12) United States Patent
Feng et al.

(10) Patent No.: US 11,545,361 B2
(45) Date of Patent: Jan. 3, 2023

(54) METHOD AND APPARATUS FOR COATING PHOTO RESIST OVER A SUBSTRATE

(71) Applicant: TAIWAN SEMICONDUCTOR MANUFACTURING CO., LTD., Hsinchu (TW)

(72) Inventors: Tung-Hung Feng, Hsinchu (TW); Hui-Chun Lee, Hsinchu (TW); Sheng-Wen Jiang, Hsinchu (TW); Shih-Che Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 163 days.

(21) Appl. No.: 17/037,785

(22) Filed: Sep. 30, 2020

(65) Prior Publication Data
US 2021/0343521 A1    Nov. 4, 2021

Related U.S. Application Data

(60) Provisional application No. 63/017,490, filed on Apr. 29, 2020.

(51) Int. Cl.
*H01L 21/027* (2006.01)
*H01L 21/67* (2006.01)
*H01L 21/033* (2006.01)
*G03F 7/20* (2006.01)

(52) U.S. Cl.
CPC ...... *H01L 21/0274* (2013.01); *G03F 7/70033* (2013.01); *H01L 21/033* (2013.01); *H01L 21/67017* (2013.01)

(58) Field of Classification Search
CPC .............. H01L 21/0274; H01L 21/033; H01L 21/67017; H01L 21/6715; H01L 21/68764; G03F 7/70033; G03F 7/0035; G03F 7/16
See application file for complete search history.

(56) References Cited

U.S. PATENT DOCUMENTS

| 5,968,592 | A | 10/1999 | Yoshida et al. |
| 9,855,579 | B2 * | 1/2018 | Yang .................. B05C 11/1039 |
| 2001/0003965 | A1 * | 6/2001 | Sada .................. H01L 21/6715 118/63 |
| 2002/0031604 | A1 | 3/2002 | Kim et al. |
| 2003/0021906 | A1 * | 1/2003 | Sago .................. H01L 21/6715 427/420 |

(Continued)

FOREIGN PATENT DOCUMENTS

| JP | 3504444 B2 | 3/2004 |
| KR | 10-1999-0011924 A | 2/1999 |

(Continued)

*Primary Examiner* — Mohammed Shamsuzzaman
(74) *Attorney, Agent, or Firm* — McDermott Will & Emery LLP (57) ABSTRACT

In a method of coating a photo resist over a wafer, dispensing the photo resist from a nozzle over the wafer is started while rotating the wafer, and dispensing the photo resist is stopped while rotating the wafer. After starting and before stopping the dispensing the photo resist, a wafer rotation speed is changed at least 4 times. During dispensing, an arm holding the nozzle may move horizontally. A tip end of the nozzle may be located at a height of 2.5 mm to 3.5 mm from the wafer.

16 Claims, 7 Drawing Sheets

(56) References Cited

U.S. PATENT DOCUMENTS

| | | | |
|---|---|---|---|
| 2004/0124173 A1* | 7/2004 | Hess | A61M 11/005 216/27 |
| 2009/0191720 A1* | 7/2009 | Nakagawa | H01L 21/6715 438/782 |
| 2010/0304311 A1* | 12/2010 | Oshima | G03F 7/0035 430/325 |
| 2011/0117283 A1* | 5/2011 | Hsueh | H01L 21/6715 118/58 |
| 2019/0164900 A1 | 5/2019 | Shiba et al. | |
| 2019/0253078 A1 | 8/2019 | Goettfert et al. | |

FOREIGN PATENT DOCUMENTS

| | | | |
|---|---|---|---|
| TW | 201815487 A | 5/2018 | |
| TW | 201900593 A | 1/2019 | |
| WO | WO-2009116180 A1 * | 9/2009 | H01L 21/6715 |

* cited by examiner

| Step | Time | Speed | Accel | Dispense | Nozzle Position | Moving Speed |
|---|---|---|---|---|---|---|
| 0 | | S0 | A1 | Off | Center | |
| 1 | T1 | S1 | A2 | | Center | |
| 2 | T2 | S2 | A3 | On | Center | |
| 3 | T3 | S3 | A4 | | Center | |
| 4 | T4 | S4 | A5 | | Center | |
| 5 | T5 | S5 | A6 | | Moving (+M1) | S15 |
| 6 | T6 | S6 | A7 | | Shift (+M1) | |
| 7 | T7 | S7 | | Off | | |

| map 55pts |  |  |  |
|---|---|---|---|
| max | 365.3 | 404.1 | 434.9 |
| min | 357.6 | 396.4 | 424.5 |
| mean | 360.6 | 399.4 | 428.2 |
| range (55pts) | 7.6 | 7.7 | 10.4 |

Fig. 6A

| map 55pts |  |  |  |
|---|---|---|---|
| max | 364.6 | 402.4 | 433.7 |
| min | 358.2 | 396.8 | 425.3 |
| mean | 360.3 | 398.9 | 428.6 |
| range (55pts) | 6.3 | 5.6 | 8.4 |

Fig. 6B

| Bare-Si | | |
|---|---|---|
| 0.3cc fail | 0.4cc ok | 0.5cc ok |
|  |  |  |
| NA | NA | 225 Range: 10.9 (225pt) Marathon 8 pcs (10.9~13.5A) |

Fig. 7A

| Bare-Si | | |
|---|---|---|
| 0.4cc fail | 0.5cc ok | 0.6cc ok |
|  |  |  |
| NA | NA | 225 Range: 5.7 (225pt) Marathon 8 pcs (5.7~6.9A) |

Fig. 7B

METHOD AND APPARATUS FOR COATING PHOTO RESIST OVER A SUBSTRATE

RELATED APPLICATIONS

This application claims priority to U.S. Provisional patent application No. 63/017,490 filed on Apr. 29, 2020, the entire disclosure of which is incorporated herein by reference.

BACKGROUND

A photolithography operation is one of the key operations in the semiconductor manufacturing process. Photolithography techniques include ultraviolet lithography, deep ultraviolet lithography, and extreme ultraviolet lithography (EUVL). A photolithography operation is generally a high cost process, and reduction of the cost is one of the problems to be solved. In particular, in EUV lithography, the cost of the photo resist is much higher than the cost of a deep UV resist.

BRIEF DESCRIPTION OF THE DRAWINGS

FIGS. 5A, 5B and 5C shows show various nozzle configurations according to embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

As set forth above, reduction of the cost of photo resist is one of the key issues in the lithography operation. One of the approaches to reduce the cost of the photo resist is to reduce a usage (dispense) amount per wafer or substrate of the photo resist. However, simply reducing the dispense amount of the photo resist would result in non-uniform coating of the photo resist on the wafer, which would increase defective patterns after development of the photo resist after exposure.

In the present disclosure, a method and an apparatus for coating a photo resist over a wafer or a substrate that can reduce the usage of the photo resist slurry without degrading uniformity of thickness of the coated photo resist are provided.

For example, according to one or more embodiments, a resist dispense amount can be reduced to 0.35-0.65 cc ($cm^3$) per 300 mm wafer with the thickness variation (range) of less than 2 nm (more than zero) for the average resist thickness of about 30-50 nm. In other embodiments, the thickness variation is more than 0.5 nm to less than about 1.0 nm for the average resist thickness of about 30-50 nm. In some embodiments, the thickness variation when the average resist thickness of about $T_0$ (nm) is about 1% to about 2% of $T_0$. The target resist thickness is in a range from about 10 nm to about 120 nm in some embodiments.

Figure 1A:
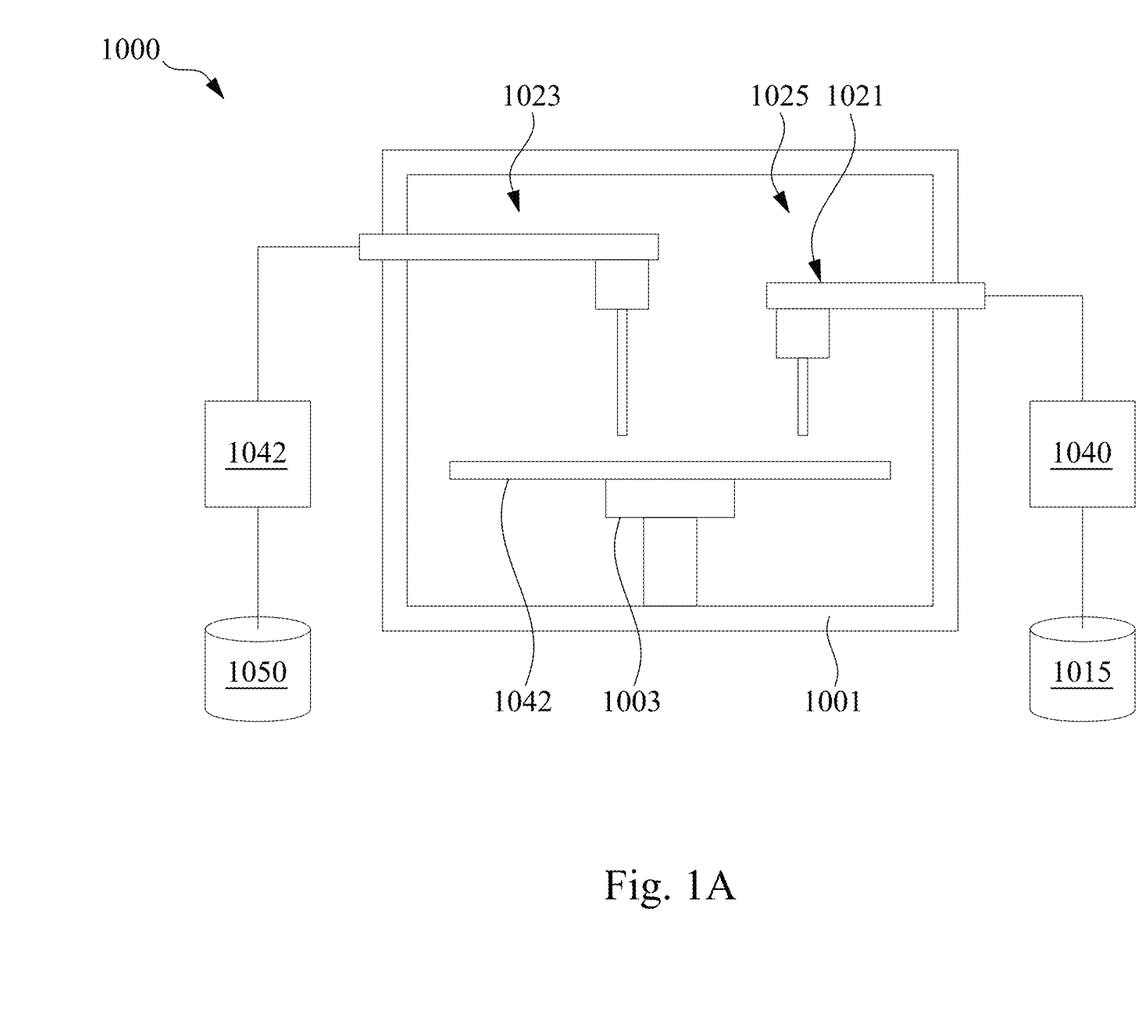
FIGS. 1A and 1B are schematic views of a photo resist coating apparatus according to an embodiment of the present disclosure.
Figure 1B:
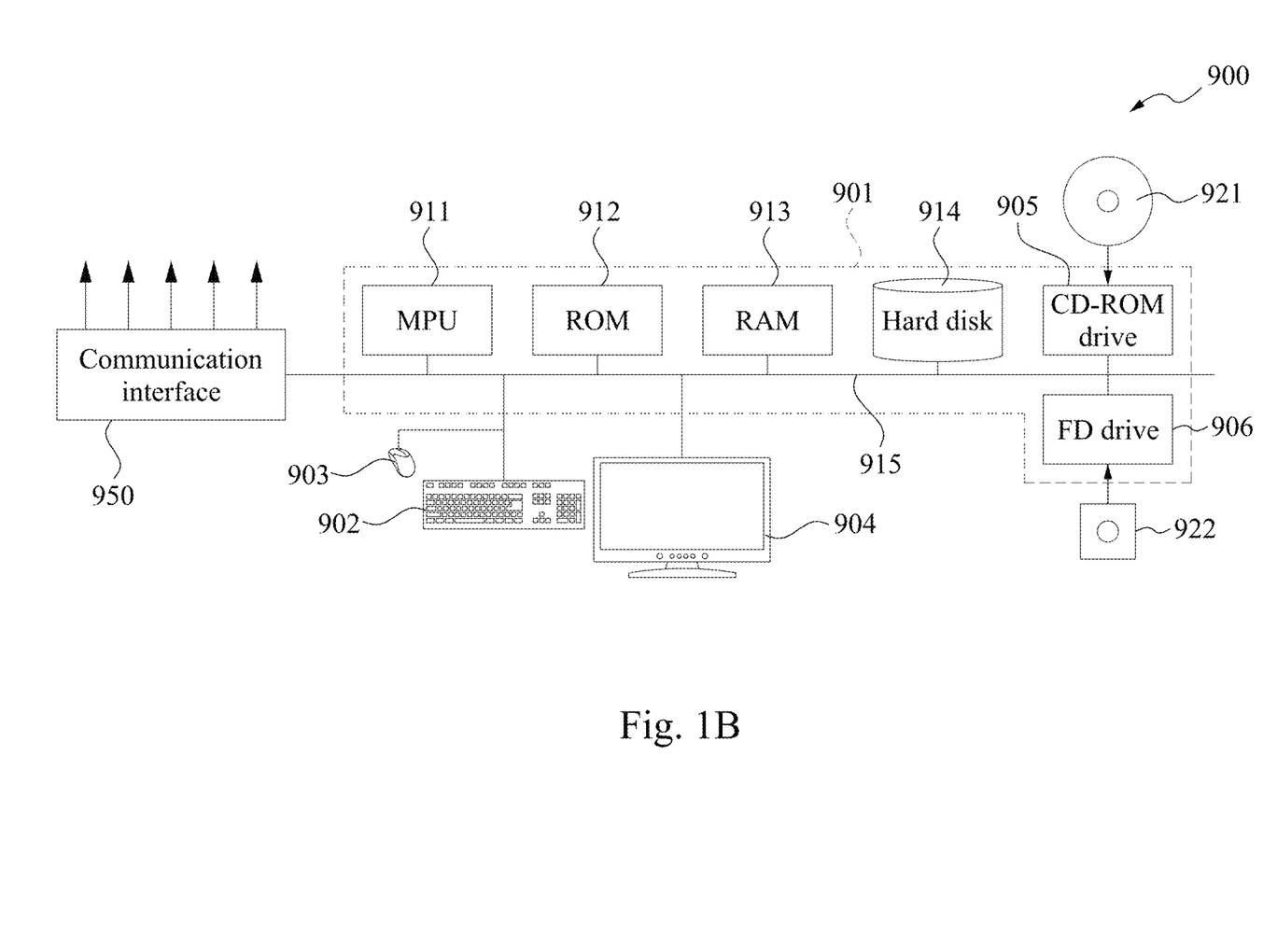

FIGS. 1A and 1B are schematic views of a photo resist coating apparatus according to an embodiment of the present disclosure. One of ordinary skill in the art would understand that one or more additional features are utilized with an apparatus shown in FIGS. 1A and 1B.

A photo resist coating apparatus 1000 includes a housing or an enclosure 1001 in which a substrate holder 1003 is disposed, as shown in FIG. 1A. The substrate holder is configured to hold a wafer or a substrate 1010 by vacuum (vacuum chuck) and include a motor to rotate the wafer at various speeds. The substrate holder 1003 is also configured to move the wafer up and down. The apparatus 1000 includes several fluid nozzles, including a photo resist dispense nozzle 1021 configured to dispense a photo resist and an edge cut solution nozzle 1023 configured to dispense a solvent to remove the coated photo resist from an edge portion of the wafer. In some embodiments, multiple nozzles for different photo resists are provided. The nozzles are coupled to movable arms respectively, and movable in transverse (horizontal) directions and in the vertical direction in some embodiments. The movable arms include one or more of motors, gears, power transfer belts, or other known components to move the nozzles horizontally and/or vertically. The fluid nozzle 1021 is fluidly connected to a photo resist source (e.g., a bottle or a tank) 1015 storing a photo resist, and the fluid nozzle 1023 is fluidly connected to a solvent source 1050 storing a solvent. One or more pumps 1040 with one or more filters and one or more valves are disposed on a fluid path from the photo resist source 1015 to the nozzle 1021, and one or more pumps 1042 with one or more filters and one or more valves are disposed on a fluid path from the solvent source 1050 to the nozzle 1023.

In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

At least a part of the operations of the photo resist coating apparatus 1000 is controlled by one or more control system 900, as shown in FIG. 1B, communicably connected to or included in the photo resist coating apparatus 1000.

When the control program is executed by the computer, the control system 900 controls the operations of, for example, rotation of the substrate holder 1003, the arms coupled to the nozzles 1021 and 1023, and/or the pump systems 1040, 1042, according to a selected coating recipe. FIG. 1B also shows a schematic view of a control system 900 that executes control of the photo resist coating apparatus 1000 according to one or more embodiments. All of or a part of the process, method and/or operations of the photo resist coating apparatus 1000 can be realized using computer hardware and computer programs executed thereon. The control system 900 is provided with a computer 901 including an optical disk read only memory (e.g., CD-ROM or DVD-ROM) drive 905 and a magnetic disk drive 906, a keyboard 902, a mouse 903, and a monitor 904. The computer 901 is provided with, in addition to the optical disk drive 905 and the magnetic disk drive 906, one or more processors 911, such as a micro processing unit (MPU), a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN. The program for causing the computer system 900 to execute the functions of the photo resist coating apparatus 1000 may be stored in an optical disk 921 or a magnetic disk 922, which are inserted into the optical disk drive 905 or the magnetic disk drive 906, and transmitted to the hard disk 914. In particular, one or more coating recipes are stored in one or more of the foregoing memories.

Alternatively, the recipes may be transmitted via a network (not shown) to the computer 901 and stored in the hard disk 914. At the time of execution, the recipes are loaded into the RAM 913. The program may be loaded from the optical disk 921 or the magnetic disk 922, or directly from a network. The program does not necessarily have to include, for example, an operating system (OS) or a third party program to cause the computer 901 to execute the functions of the resist coating apparatus 1000. The program may only include a command portion to call an appropriate function (module) in a controlled mode and obtain desired results.

Figure 2A:
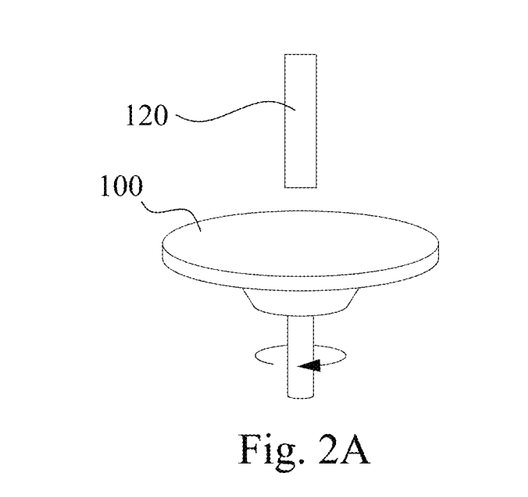
FIGS. 2A, 2B, 2C, 2D, 2E and 2F illustrate various stages of a sequential process for coating a photo resist on a wafer/substrate according to an embodiment of the present disclosure.
Figures 2B, 2C:
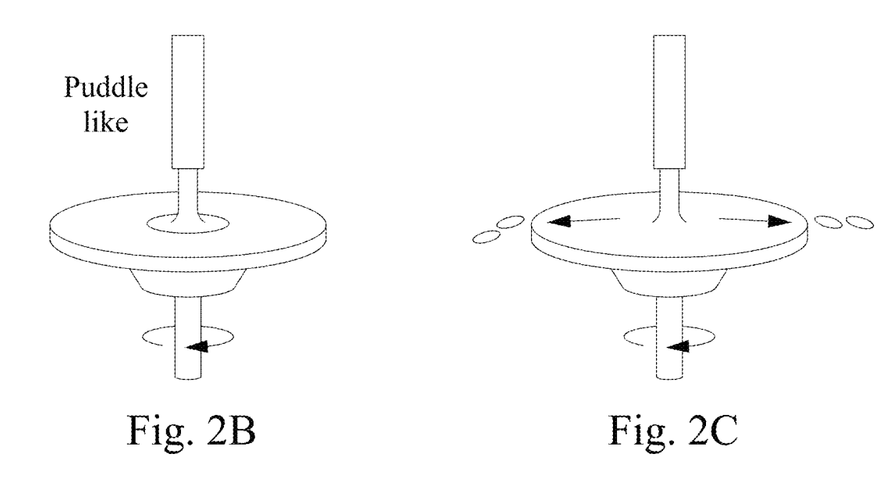
Figure 2D:
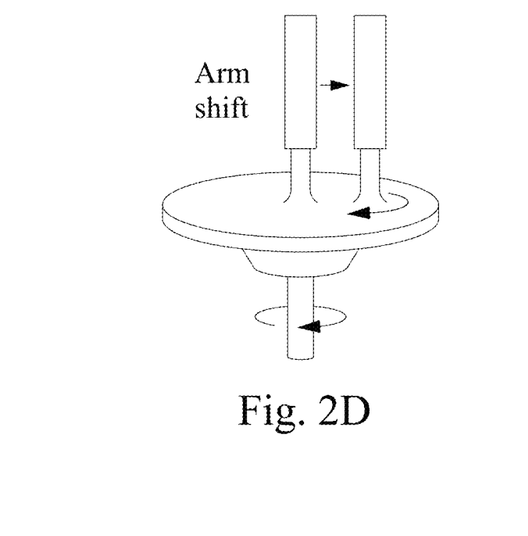
Figure 2E:
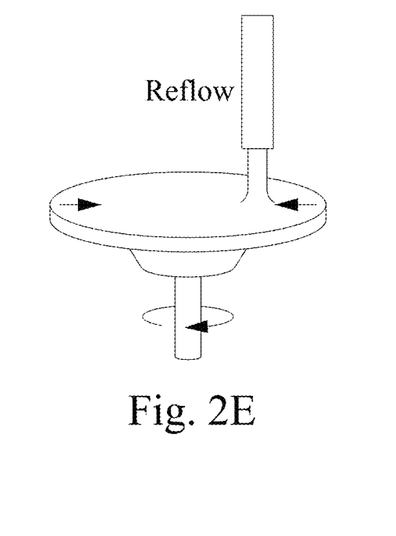
Figure 2F:
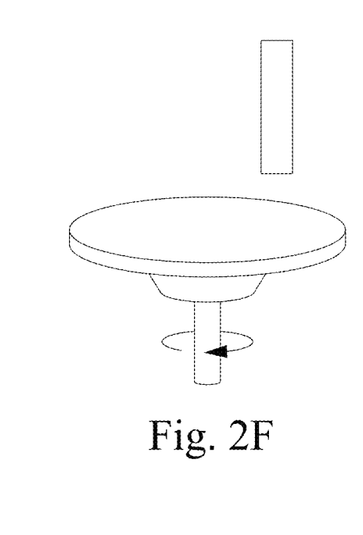
Figure 2G:
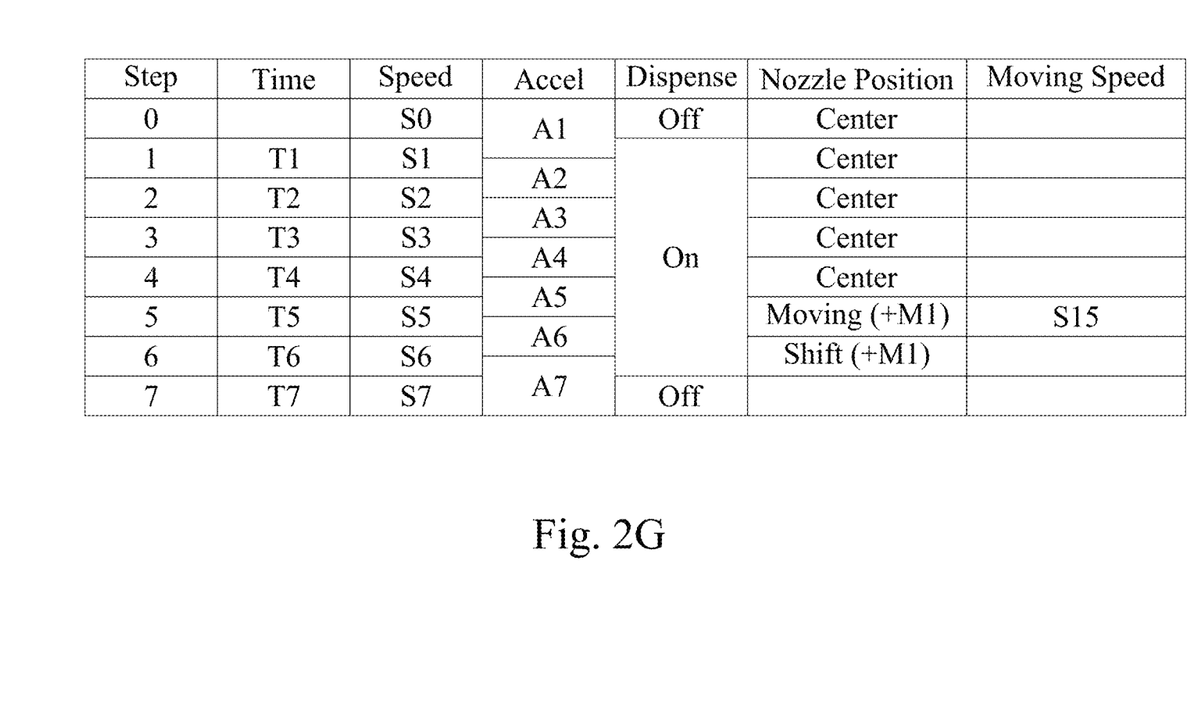
FIG. 2G shows a resist coating sequence (recipe) according to embodiments of the present disclosure.

FIGS. 2A-2F show a resist coating operation and FIG. 2G shows detailed steps (recipe) of the resist coating operation according to the present disclosure. In some embodiments, the recipe for coating a photo resist is stored in a memory of the photo resist coating apparatus. In some embodiments, the recipe is stored in a memory, such as a flash memory, a CD-ROM, or DVD-ROM, and can be copied from one apparatus to another apparatus. Further, in some embodiments, the recipe is distributed from a server to a plurality of photo resist coating apparatuses.

As shown in FIG. 2A, a wafer 100 is rotated at a predetermined speed. Then, a photo resist is dispensed from a nozzle 120 while the wafer is clockwise rotated as shown in FIG. 2B. In some embodiments, the nozzle 120 is located above the center of the wafer 100. The dispensing the photo resist continues while the wafer 100 is rotating as shown in FIG. 2C. Then the nozzle 120 moves horizontally along the diameter of the wafer while dispensing the photo resist and rotating the wafer as shown in FIG. 2D. The dispensing continues from the nozzle 120 at the shifted location while rotating the wafer 120, as shown in FIG. 2E, and then as shown in FIG. 2F, the dispensing stops. In some embodiment, the wafer 100 is a semiconductor wafer (e.g., Si wafer) of which diameter is 150 mm, 200 mm or 300 mm. In some embodiments, one or more layers or features are formed on the semiconductor wafer 100.

As shown in FIG. 2G, the rotation speed of the wafer changes at least four times during the dispensing the photo resist. In some embodiments, the rotation speed of the wafer changes five or six times during the dispensing the photo resist. In some embodiments, the photo resist coating sequence includes 6 steps with different conditions. Step 0 is a pre-dispense sequence which includes multiple steps corresponding to FIG. 2A, and Step 7 is a post-dispensing step which also includes multiple steps corresponding to FIG. 2F. In some embodiments, the wafer is treated by a resist priming material (e.g., hexamethyldisilazane (HMDS)) to improve adhesion between the wafer surface and the photo resist.

In some embodiments, the pre-dispense sequence includes applying a chemical compound for resist reduction consumption, which is a pre-wet process to improve the surface condition of the wafer. In some embodiments, the chemical compound includes a solvent that is used for an edge-cut operation and/or a backside cleaning operation in the post-dispensing sequence. In some embodiments, the solvent is applied to the wafer at a wafer rotation speed of about 100 rpm to about 500 rpm for about 10 sec to about 30 sec. After the solvent is applied for resist reduction consumption, the wafer is rotated at about 100 rpm to about 500 rpm for about 0.5 sec to about 2 sec in some embodiments.

In some embodiments, at Step 1, the dispensing of the photo resist starts. In some embodiments, the wafer rotation speed S1 in Step 1 is in a range from about 50 rpm to about 1000 rpm. In other embodiments, the wafer rotation speed S1 in Step 1 is in a range from about 50 rpm to about 150 rpm. The acceleration A1 from the speed S0 at the last step of the pre-dispense sequence to the speed S1 is in a range from about 1000 rpm/sec$^2$ to about 30000 rpm/sec$^2$ in some embodiments, and is in a range from about 5000 rpm/sec$^2$ to 15000 rpm/sec$^2$ in other embodiments. The time duration T1 of Step 1 is in a range from about 0.6 sec to about 1.0 sec in some embodiments, and is in a range from about 0.7 sec to 0.9 sec in other embodiments. In Step S1, the dispensed photo resist forms a puddle on the wafer at a relatively low wafer rotation speed. In some embodiments, the nozzle location is at the center of the wafer.

In some embodiments, at Step 2, the puddle of the photo resist is spread over the wafer at a high speed, which corresponds to FIG. 2C. In some embodiments, the wafer rotation speed S2 in Step 2 is in a range from about 2500 rpm to about 4000 rpm. In other embodiments, the wafer rotation speed S2 in Step 2 is in a range from about 3000 rpm to about 4000 rpm. The acceleration A2 from the speed S1 at Step 1 to the speed S2 is in a range from about 15000 rpm/sec$^2$ to about 30000 rpm/sec$^2$ in some embodiments, and is in a range from about 20000 rpm/sec$^2$ to 25000 rpm/sec$^2$ in other embodiments. The time duration T2 of Step 2 is smaller than T1 and in a range from about 0.1 sec to about 0.3 sec in some embodiments, and is in a range from about 0.15 sec to 0.25 sec in other embodiments. In some embodiments, the nozzle location is at the center of the wafer.

In some embodiments, at Step 3, the spread photo resist is re-flowed by reducing the speed. In some embodiments, the wafer rotation speed S3 in Step 3 is lower than the speed S2 and higher than the speed S1, and is in a range from about 100 rpm to about 2500 rpm. In other embodiments, the wafer rotation speed S3 in Step 3 is in a range from about 1500 rpm to about 1900 rpm. The acceleration A3 from the speed S2 at Step 2 to the speed S3 is in a range from about 1000 rpm/sec$^2$ to about 30000 rpm/sec$^2$ in some embodiments, and is in a range from about 5000 rpm/sec$^2$ to 15000 rpm/sec$^2$ in other embodiments. The time duration T3 of Step 3 is in a range from about 0.1 sec to about 0.3 sec in some embodiments, and is in a range from about 0.15 sec to 0.25 sec in other embodiments. In some embodiments, the nozzle location is at the center of the wafer.

In some embodiments, at Step 4, the thickness of the spread photo resist is tuned by increasing the speed. In some embodiments, the wafer rotation speed S4 in Step 4 is higher than the speed S3 and S1 and lower than the speed S2, and is in a range from about 1000 rpm to about 3000 rpm. In other embodiments, the wafer rotation speed S4 in Step 4 is in a range from about 2000 rpm to about 2500 rpm. The acceleration A4 from the speed S3 at Step 3 to the speed S4 is in a range from about 10000 rpm/sec$^2$ to about 30000 rpm/sec$^2$ in some embodiments, and is in a range from about 15000 rpm/sec$^2$ to 25000 rpm/sec$^2$ in other embodiments. The time duration T4 of Step 4 is longer than T3 and in a range from about 0.3 sec to about 0.7 sec in some embodiments, and is in a range from about 0.4 sec to 0.6 sec in other embodiments. In some embodiments, the nozzle location is at the center of the wafer.

In some embodiments, at Step 5, the nozzle position moves while dispensing to further tune the thickness of the photo resist, which corresponds to FIG. 2D. In some embodiments, the total nozzle movement distance M1 is in a range from about 1 mm to about 15 mm and is in a range from about 5 mm to about 10 mm in other embodiments, in a case of a 300 mm wafer. In some embodiments, the nozzle movement distance M1 is proportionally adjusted depending on the diameter of the wafer. In some embodiments, the speed S15 of the nozzle movement is in a range from about 25 mm/sec to about 294 mm/sec and is in a range from about 100 mm/sec to about 200 mm/sec in other embodiments. When the nozzle moves faster or slower than the above ranges, the thickness variation of the coated photo resist increases beyond the required variation.

In some embodiments, the wafer rotation speed S5 in Step 5 is higher than the speed S3 and S1 and lower than the speed S2, and is in a range from about 1000 rpm to about 3000 rpm. In other embodiments, the wafer rotation speed S5 in Step 5 is in a range from about 2000 rpm to about 2500 rpm. The acceleration A5 from the speed S4 at Step 4 to the speed S5 is in a range from about 10000 rpm/sec$^2$ to about 30000 rpm/sec$^2$ in some embodiments, and is in a range from about 20000 rpm/sec$^2$ to 25000 rpm/sec$^2$ in other embodiments. In some embodiments, the speed S5 is equal to the speed S4, and thus the acceleration A5 is zero. The time duration T5 of Step 5 is shorter than T4 and in a range from about 0.1 sec to about 0.3 sec in some embodiments, and is in a range from about 0.15 sec to 0.25 sec in other embodiments. In some embodiments, the nozzle movement begins and/or finishes within the time duration T5.

In some embodiments, at Step 6, the spread photo resist is re-flowed by reducing the speed as shown in FIG. 2E. In some embodiments, the wafer rotation speed S6 in Step 6 is lower than the speeds S4 and S5 and higher than the speed S1, and is in a range from about 500 rpm to about 2500 rpm. In other embodiments, the wafer rotation speed S6 in Step 6 is in a range from about 500 rpm to about 1500 rpm. The acceleration A6 from the speed S5 at Step 5 to the speed S6 is in a range from about 1000 rpm/sec$^2$ to about 30000 rpm/sec$^2$ in some embodiments, and is in a range from about 5000 rpm/sec$^2$ to 15000 rpm/sec$^2$ in other embodiments. The time duration T6 of Step 6 is longer than T5 and is in a range from about 0.3 sec to about 0.7 sec in some embodiments, and is in a range from about 0.4 sec to 0.6 sec in other embodiments. In some embodiments, the nozzle location is at the shifted position. In some embodiments, during or at the end of the Step 6, the resist dispense stops. In some embodiments, the dispense stops at about 0.08 sec to 0.12 sec after the beginning of step 6.

After the step 6, the post-dispense sequence Step 7 is performed as shown in FIG. 2F. The post-dispense sequence includes various steps, such as a drying rotation, an edge-cut operation to remove the coated photo resist at the edge of the wafer (e.g., 3-5 mm) and a back-side rinsing operation to clean the backside of the wafer 100. The rotation speed S7 in the post-dispense sequence Step 7 varies depending on the operations and is in a range from about 500 rpm to 1500 rpm in some embodiments. The acceleration A7 from the speed S6 at Step 6 to the speed S7 is in a range from about 1000 rpm/sec$^2$ to about 30000 rpm/sec$^2$ in some embodiments, and is in a range from about 5000 rpm/sec$^2$ to 15000 rpm/sec$^2$ in other embodiments.

In the foregoing embodiments, the pump supplies the photo resist at a rate of about 0.1 cc/sec to about 0.3 cc/sec in some embodiments, and in other embodiments, the rate is about 0.15 cc/sec to about 0.25 cc/sec. The total dispensed amount of the photo resist is in a range from about 0.35 cc to about 0.6 cc in some embodiments, and is in a range from about 0.4 cc to 0.5 cc in other embodiments. The sequence as set forth above is adjusted in view of the viscosity of the photo resist. The total dispense amount can be adjusted by adjusting one or more of the time durations in Steps 1-6 and/or by adjusting the pump speed.

In some embodiments, the photo resist is an EUV photo resist, a DUV photo resist, a UV photo resist, or an e-beam photo resist. The photo resist according to the present disclosure is a chemically amplified resist including a polymer resin, a photoactive compound (PAC) and a solvent. In some embodiments, the polymer resin includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like. In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure.

The PACs are photoactive components, such as photoacid generators, photobase generators, free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines, nitrobenzyl esters, and the s-triazine derivatives, combinations of these, or the like. In some embodiments in which the PACs are photobase generators, the PACs include quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, combinations of these, or the like.

In some embodiments, a cross-linking agent is added to the photo resist. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photo resist. Such an increase in density and linking density helps to improve the resist pattern.

In some embodiments, a quencher is added to the photo resist. A quencher inhibits diffusion of the generated acids/bases/free radicals within the photo resist. The quencher improves the resist pattern configuration as well as the stability of the photo resist over time.

In some embodiments, an organometallic compound is added to the photo resist to increase absorption of EUV. In some embodiments, organometallic compound includes one or more metal oxides nanoparticles selected from the group consisting of titanium dioxide, zinc oxide, zirconium dioxide, nickel oxide, cobalt oxide, manganese oxide, copper oxides, iron oxides, strontium titanate, tungsten oxides, vanadium oxides, chromium oxides, tin oxides, hafnium oxide, indium oxide, cadmium oxide, molybdenum oxide, tantalum oxides, niobium oxide, aluminum oxide, and combinations thereof. As used herein, nanoparticles are particles having an average particle size between about 1 nm and about 20 nm. In some embodiments, the metal oxide nanoparticles have an average particle size between about 2 nm and about 5 nm. In some embodiments, the amount of metal oxide nanoparticles in the photo resist composition ranges from about 1 wt. % to about 15 wt. % based on the weight of the solvent. In some embodiments, the amount of nanoparticles in the photo resist composition ranges from about 5 wt. % to about 10 wt. % based on the weight of the solvent.

In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

The viscosity of the photo resist is adjusted to a range from about 1.0 centipoise (mPa·s) to about 2.5 centipoise is some embodiments. When the viscosity of the photo resist is high, the total dispense amount is set higher. In some embodiments, the thickness of the photo resist is in a range from about 20 nm to about 500 nm and is in a range from about 30 nm to about 120 nm depending on the process requirements (e.g., dry etching selectivity). The thickness can be adjusted by adjusting one or more of the rotation speed, the time durations in the steps 1-6, the total dispense amount, the nozzle moving speed and/or the nozzle moving amount in step 5. In some embodiments, the nozzle moving amount is set longer (e.g., 8 mm to 12 mm) to obtain the resist thickness equal to or greater than 100 nm. In some embodiments, the nozzle moving amount is set shorter (e.g., 4 mm to 6 mm) to obtain the resist thickness smaller than 100 nm. In some embodiments, the rotation speed at Step 2 is set lower (e.g., 2800 rpm to 3200 rpm) to obtain the resist thickness equal to or greater than 100 nm. In some embodiments, the rotation speed at Step 2 is set higher (e.g., 3300 rpm to 3700 rpm) to obtain the resist thickness smaller than 100 nm.

Figure 3:
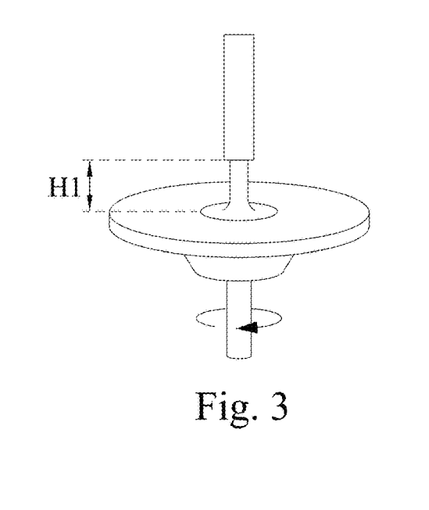
FIG. 3 illustrates a nozzle height effect according to an embodiment of the present disclosure.

FIG. 3 shows a nozzle tip height effect according to the embodiments of the present disclosure. In some embodiments, the nozzle tip (dispensing opening) of the nozzle 120 is set at the height H1 from the surface of the wafer 100 during the dispensing. In some embodiments, the height H1 is in a range from about 2.0 mm to about 4.0 mm and is in a range from about 2.5 mm to about 3.5 mm in other embodiments.

The low height of the nozzle tip can reduce resist dispense momentum, which prevents resist splashing on the wafer, and enables continuous dispense instead of droplets. In particular, when the wafer rotation speed at Step 1 is low, the low height of the nozzle tip more effectively prevents resist splashing. When the height is smaller than the disclosed ranges, smooth dispensing of the photo resist is impaired, which would result in non-uniform resist thickness. When the height is greater than these ranges, resist splashing would likely occur.

Figures 4A, 4B:
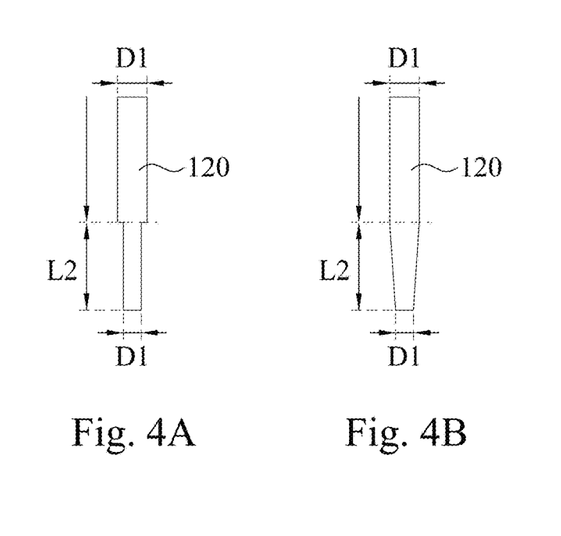
FIGS. 4A, 4B and 4C show various nozzle configurations according to embodiments of the present disclosure.
Figure 4C:
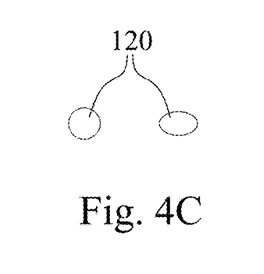

FIG. 4A is a schematic view of a resist dispense nozzle 120 according to embodiments of the present disclosure. In some embodiments, the end opening of the nozzle has a circular shape, as shown in FIG. 4C, having a diameter D1 (inner diameter) in a range from about 0.4 mm to about 0.6 mm. In other embodiments, the diameter is in a range from about 0.45 mm to about 0.55 mm. When the diameter is smaller than the ranges, smooth dispensing of the photo resist is impaired, which would result in non-uniform resist thickness. When the diameter is greater than these ranges, the resist consumption is large and the cost of the photo resist operation per wafer increases.

In some embodiments, as shown in FIG. 4A, the inner diameter of the nozzle 120 is constant from the tip end within some distance L1, for example, at least about 0.5 cm to about 3 cm. In other embodiments, the inner diameter of the nozzle decreases from the diameter D2 toward the tip end, as shown in FIG. 4B. In some embodiments, the diameter D2 is in a range from about 1 mm to about 3 mm.

In some embodiments, the nozzle has a tapered shape (inside) decreasing the diameter from D2 to D1 at a constant rate. In some embodiments, the tapered portion L2 is in a range about 0.5 cm to about 3 cm. A ratio of the height H1 to the diameter D2 is in a range from about 3.3 to about 10.

In some embodiments, the shape of the end opening of the nozzle 120 is oval as shown in FIG. 4C, and in such a case, the diameter D1 is the average of the short diameter (minor axis) and the long diameter (major axis) of the oval shape.

Figure 5A:
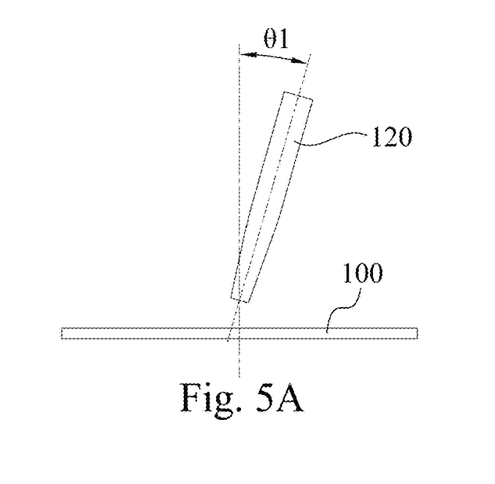
Figure 5B:
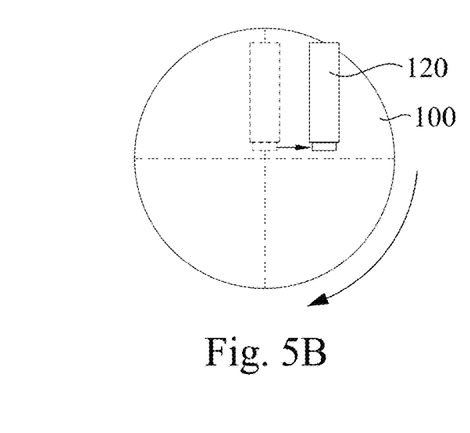

In some embodiments, the nozzle 120 is tilted with respect to the normal direction of the wafer 100, as shown in FIG. 5A. The tilt angle θ1 is more than zero degrees and equal to or less than about 10 degrees in some embodiments. In some embodiments, as shown in FIGS. 5B and 5C, the nozzle 120 is tilted along the rotation direction (tangent direction of the rotation) at the shifted position so that the resist dispensing direction coincides with the wafer rotation direction. As shown in FIGS. 5B and 5C, when the nozzle 120 is tilted, the nozzle moves at Step 5 such that the angle between the resist dispensing direction and the rotation direction does not change. In other embodiments, the angle between the resist dispensing direction and the rotation direction changes during the nozzle moving at Step 5.

In some embodiments, the tilt angle θ1 is fixed during the resist dispensing. In other embodiments, the tilt angle θ1 varies during the resist dispensing. In some embodiments, at the beginning, during or at the end of the nozzle moving at Step 5, the tilt angle is changed. In certain embodiments, before the Step 5 (Steps 1-4), the tilt angle θ1 is set to zero degrees, and in the Step 5, the tilt angle θ1 is set larger than zero degrees. In some embodiments, the tilt angle θ1 gradually changes in the Step 5, and in other embodiments, the tilt angle θ1 changes in a step-wise manner. When the opening shape of the nozzle has an oval shape as shown in FIG. 4B, the major axis is parallel to the wafer 100 in some embodiments.

Figure 6A:
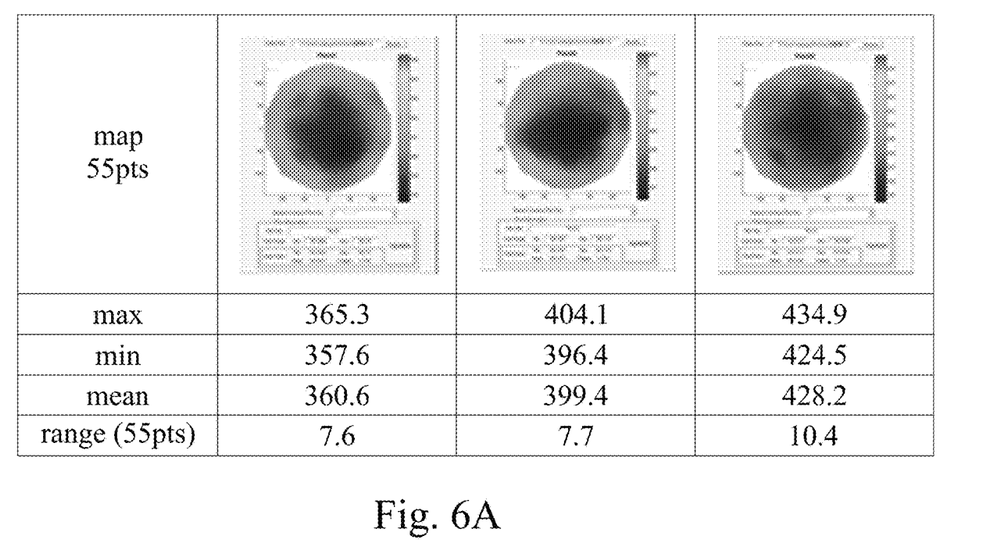
FIGS. 6A and 6B show the effect of a nozzle height and a nozzle size according to embodiments of the present disclosure.
Figure 6B:
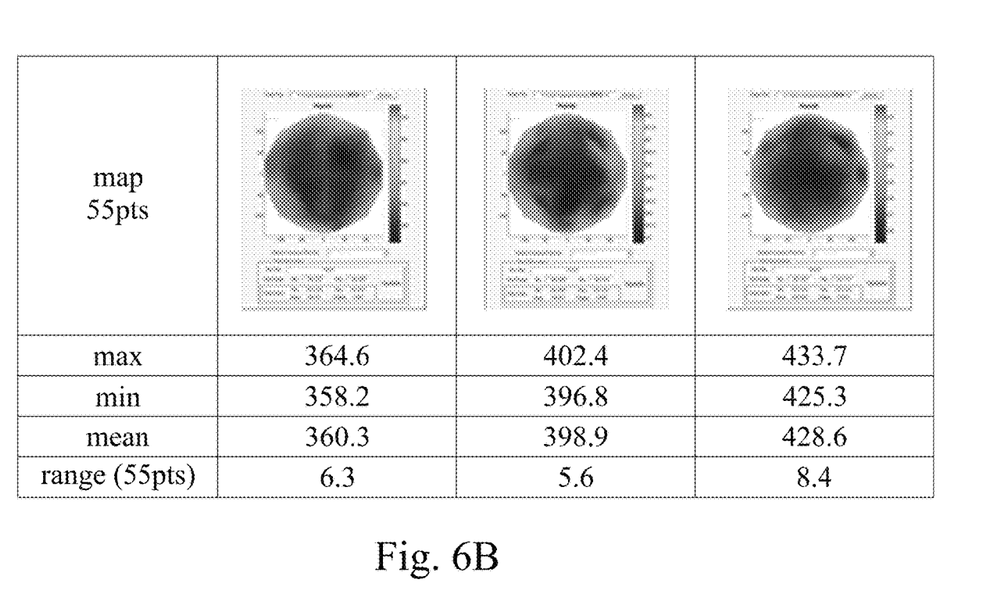

FIGS. 6A and 6B show the effects of the nozzle height. FIG. 6A shows resist thickness variations when the nozzle end opening size is 0.8 mm and the nozzle height is 5 mm, and FIG. 6B shows resist thickness variations when the nozzle end opening size is 0.5 mm and nozzle height is 3 mm, for three different target thicknesses (36 nm, 40 nm and 43 nm). Fifty-five (55) points were measured on a 300 mm Si wafer (bare Si). As shown in FIGS. 6A and 6B, by reducing the nozzle end opening size and the nozzle height from the wafer surface, the uniformity of the resist thickness improves by about 17% to about 27%.

Generally, the resist dispense amount for a 300 mm wafer has been about 0.6 cc to about 1.5 depending on the types (e.g., viscosity) of photo resists. By using the aforementioned embodiments, it is possible to reduce the resist dispensing amount from about 20% to about 75%.

Figure 7A:
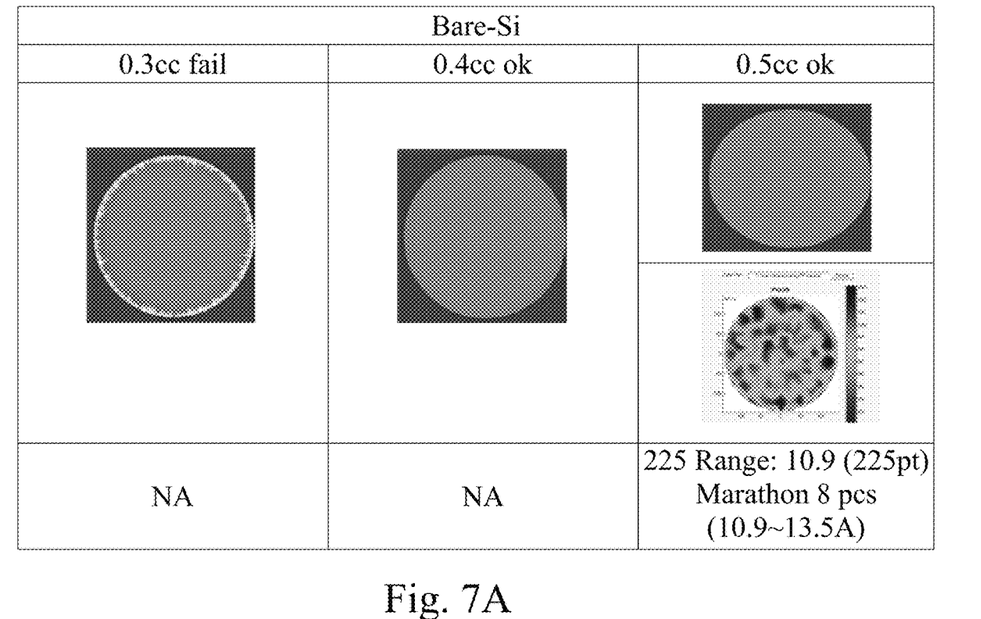
FIGS. 7A and 7B show reduction effects of the resist dispense amount according to embodiments of the present disclosure.
Figure 7B:
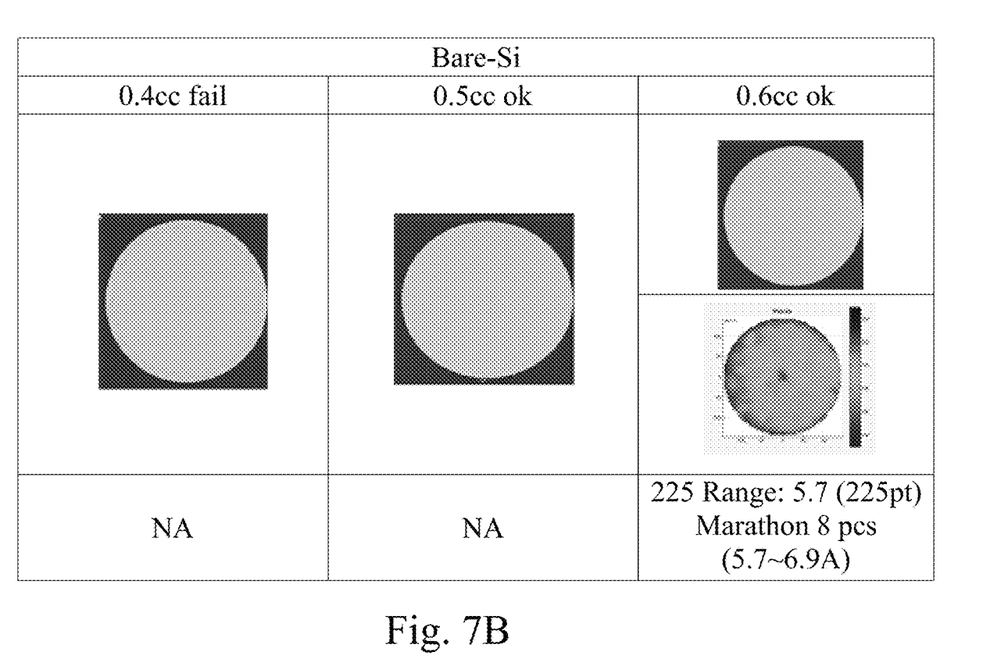

FIGS. 7A and 7B show the reduction effects of the resist dispense amount according to embodiments of the present disclosure. In FIGS. 7A and 7B, the coated resist thickness on a 300 mm bare Si wafer was measured at 225 points for 8 wafers by varying the total resist dispensing amount per wafer. In FIGS. 7A and 7B, the nozzle height was set to 3 mm, and the diameter of the nozzle end opening is was 0.5 mm.

In FIG. 7A, the viscosity of the photo resist is 1.5 centipoise. Although the photo resist could not be uniformly coated with a dispense amount of 0.3 cc, the photo resist could be uniformly coated with a dispense amount of 0.4 cc or more. The variation of the resist thickness for the 0.5 cc case is about 1.1 nm to about 1.4 nm for the target thickness of 100 nm.

In FIG. 7B, the viscosity of the photo resist is 2.445 centipoise. Although the photo resist could not be uniformly coated with a dispense amount of 0.4 cc, the photo resist could be uniformly coated with a dispense amount of 0.5 cc or more. The variation of the resist thickness for the 0.6 cc case is about 0.6 nm to about 0.7 nm for the target thickness of 20 nm.

When the resist coating recipe includes three steps, dispensing a photo resist at a low speed (e.g., 200-300 rpm), spreading the photo resist at a high speed (e.g., 3000-3500 rpm) with continued dispensing of the photo resist, and reflowing the photo resist at a low speed (e.g., 500-1000 rpm) with continued dispensing of the photo resist, the dispensed amount of the photo resist is about 0.7 cc to obtain the required thickness variation of less then about 1 nm. In contrast, with the recipes of the foregoing embodiments, a dispensed amount of resist could be reduced to 0.4-0.6 cc.

It will be understood that not all advantages have been necessarily discussed herein, no particular advantage is required for all embodiments or examples, and other embodiments or examples may offer different advantages.

For example, according to one or more foregoing embodiments, a dispensed resist amount is reduced to 0.4-0.6 cc per 300 mm wafer with a thickness variation (range) of less than 1.5 nm (more than zero) or less than 1 nm, which is more than 15% reduction the a conventional resist coating method. This significantly reduces cost of the lithography process by more than $10M per year.

In accordance with an aspect of the present disclosure, in a method of coating a photo resist over a wafer, dispensing the photo resist from a nozzle over the wafer is started while rotating the wafer, and dispensing the photo resist is stopped while rotating the wafer. After starting and before stopping the dispensing the photo resist, a wafer rotation speed is changed at least 4 times. In one or more of the foregoing or the following embodiments, the photo resist is dispensed while rotating the wafer at a first speed, dispensing the photo resist continues while rotating the wafer at a second speed different from the first speed, dispensing the photo resist continues while rotating the wafer at a third speed different from the second speed, dispensing the photo resist continues while rotating the wafer at a fourth speed different from the third speed, dispensing the photo resist continues while rotating the wafer at a fifth speed, and dispensing the photo resist stops while rotating the wafer at a sixth speed different from the fifth speed. In one or more of the foregoing or the following embodiments, the first speed is lower than the second to sixth speeds. In one or more of the foregoing or the following embodiments, the second speed is higher than the first and third to sixth speeds. In one or more of the foregoing or the following embodiments, the third speed is lower than the second speed. In one or more of the foregoing or the following embodiments, the fourth and fifth speeds are higher than the third speed. In one or more of the foregoing or the following embodiments, the sixth speed is lower than the fifth speed. In one or more of the foregoing or the following embodiments, the fourth speed is equal to the fifth speed. In one or more of the foregoing or the following embodiments, a total dispense amount of the photo resist is in a range from 0.35 cc to 0.65 cc. In one or more of the foregoing or the following embodiments, a tip end of the nozzle is located at a height of 2.5 mm to 3.5 mm from the wafer. In one or more of the foregoing or the following embodiments, the nozzle is tilted with respect to a normal line of the wafer.

In accordance with another aspect of the present disclosure, in a method of coating a photo resist over a wafer, dispensing the photo resist from a nozzle starts while rotating the wafer at a first speed, dispensing the photo resist continues while rotating the wafer at a second speed different from the first speed for a time duration T2, dispensing the photo resist continues while rotating the wafer at a third speed different from the second speed for a time duration T3, dispensing the photo resist continues while rotating the wafer at a fourth speed different from the third speed for a time duration T4, dispensing the photo resist continues while rotating the wafer at a fifth speed and moving the nozzle horizontally from a center toward an edge of the wafer, and after stopping the movement of the nozzle, dispensing the photo resist stops while rotating the wafer at a sixth speed different from the fifth speed. In one or more of the foregoing or the following embodiments, the nozzle moves at a speed in a range from 25 mm/sec to 294 mm/sec. In one or more of the foregoing or the following embodiments, the nozzle moves in a distance from 1 mm to 15 mm. In one or more of the foregoing or the following embodiments, a time duration T1 after the starting dispensing the photo resist to changing from the first speed to the second speed is in a range from 0.6 sec to 1.0, the T2 and the T3 are shorter than the T1 and the T4, and a time duration T5 of moving the nozzle is in a range from 0.15 sec to 0.25 sec. In one or more of the foregoing or the following embodiments, a tip end of the nozzle is located at a height of 2.5 mm to 3.5 mm from the wafer. In one or more of the foregoing or the following embodiments, the nozzle is tilted with respect to a normal line of the wafer. In one or more of the foregoing or the following embodiments, the first speed is in a range from 100 rpm to 1000 rpm, the second speed is in a range from 2000 rpm to 4000 rpm, the third speed is in a range from 1500 rpm to 1900 rpm, the fourth speed is in a range from 1000 rpm to 3000 rpm, and the sixth speed is in a range from 500 rpm to 1000 rpm. In one or more of the foregoing or the following embodiments, an average thickness of the coated photo resist is $T_0$, and a thickness variation of the coated photo resist is in a range from 1% to 2% of $T_0$.

In accordance with another aspect of the present disclosure, a photo resist coating apparatus includes a wafer holder configured to support a wafer and to rotate the wafer, a nozzle configured to dispense a photo resist, an arm coupled to the nozzle and configured to move the nozzle horizontally and vertically, and a control system including a processor and a memory storing a program and a coating recipe and configured to control the wafer holder, the nozzle and the arm according to the coating recipe. The program, when executed by the processor, causes the control system to perform starting dispensing the photo resist from the nozzle while rotating the wafer at a first speed, continuing dispensing the photo resist while rotating the wafer at a second speed different from the first speed, continuing dispensing the photo resist while rotating the wafer at a third speed different from the second speed, continuing dispensing the photo resist while rotating the wafer at a fourth speed different from the third speed, continuing dispensing the photo resist while rotating the wafer at a fifth speed, and after stopping the movement of the nozzle, stopping dispensing the photo resist while rotating the wafer at a sixth speed different from the fifth speed. In one or more of the foregoing or the following embodiments, the continuing dispensing the photo resist while rotating the wafer at the fifth speed includes moving the nozzle horizontally from a center toward an edge of the wafer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of coating a photo resist over a wafer using a photo resist coating apparatus, the photo resist coating apparatus comprising:
   a wafer holder configured to support a wafer and to rotate the wafer;
   a nozzle configured to dispense a photo resist;
   another nozzle configured to dispense a solvent;
   an arm coupled to the nozzle and configured to move the nozzle horizontally and vertically; and
   a control system configured to control the wafer holder, the nozzle, the another nozzle and the arm according to a coating recipe,
   the method comprising:
   starting dispensing the photo resist from the nozzle while rotating the wafer at a first speed while the nozzle is at a center of the wafer;
   continuing dispensing the photo resist while rotating the wafer at a second speed different from the first speed while the nozzle is at a center of the wafer;
   continuing dispensing the photo resist while rotating the wafer at a third speed different from the second speed while the nozzle is at a center of the wafer;
   continuing dispensing the photo resist while rotating the wafer at a fourth speed different from the third speed while the nozzle is at a center of the wafer;
   continuing dispensing the photo resist while rotating the wafer at a fifth speed and moving the nozzle horizontally from the center toward an edge of the wafer;
   continuing dispensing the photo resist while rotating the wafer at a sixth speed different from the fifth speed while the nozzle is at the edge of the wafer; and
   after stopping the movement of the nozzle, stopping dispensing the photo resist while rotating the wafer at a seventh speed different from the sixth speed.

2. The method of claim 1, wherein the first speed is lower than the second to sixth speeds.

3. The method of claim 1, wherein the second speed is higher than the first and third to sixth speeds.

4. The method of claim 1, wherein the fourth and fifth speeds are higher than the third speed.

5. The method of claim 1, wherein the sixth speed is lower than the fifth speed.

6. The method of claim 1, wherein the fourth speed is equal to the fifth speed.

7. The method of claim 1, wherein a total dispensed amount of the photo resist is in a range from 0.35 cc to 0.65 cc.

8. The method of claim 1, wherein a tip end of the nozzle is located at a height of 2.5 mm to 3.5 mm from the wafer.

9. The method of claim 1, wherein the nozzle is tilted with respect to a normal line of the wafer.

10. The method of claim 1, wherein the nozzle moves at a speed in a range from 25 mm/sec to 294 mm/sec.

11. The method of claim 1, wherein the nozzle moves horizontally a distance from 1 mm to 15 mm.

12. The method of claim 1, wherein:
a first time duration T1 after the starting dispensing the photo resist changing from the first speed to the second speed is in a range from 0.6 sec to 1.0 sec,
the second time duration T2 and the third time duration T3 are shorter than the first time duration T1 and the fourth time duration T4, and
a fifth time duration T5 of moving the nozzle is in a range from 0.15 sec to 0.25 sec.

13. The method of claim 1, wherein the nozzle is tilted with respect to a normal line of the wafer.

14. The method of claim 1, wherein:
the first speed is in a range from 100 rpm to 1000 rpm,
the second speed is in a range from 2000 rpm to 4000 rpm,
the third speed is in a range from 1500 rpm to 1900 rpm,
the fourth speed is in a range from 1000 rpm to 3000 rpm, and
the sixth speed is in a range from 500 rpm to 1000 rpm.

15. The method of claim 1, wherein:
an average thickness of the coated photo resist is $T_o$, and
a thickness variation of the coated photo resist is in a range from 1% to 2% of $T_o$.

16. The method of claim 1, before the starting dispensing the photo resist from the nozzle, rotating the wafer at a speed different from the first speed while the nozzle is at the center of the wafer and applying the solvent from the another nozzle to pre-wet the wafer.

* * * * *